(12) United States Patent
Lu et al.

(10) Patent No.: US 6,908,830 B2
(45) Date of Patent: Jun. 21, 2005

(54) METHOD FOR PRINTING MARKS ON THE EDGES OF WAFERS

(75) Inventors: Andrew Lu, Poughkeepsie, NY (US); Donald M. Odiwo, Wappingers Falls, NY (US); Roger J. Yerdon, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 10/604,028

(22) Filed: Jun. 23, 2003

(65) Prior Publication Data

US 2004/0259322 A1 Dec. 23, 2004

(51) Int. Cl.⁷ ............................................. H01L 21/66
(52) U.S. Cl. .................... 438/426; 438/401; 438/975
(58) Field of Search .............................. 438/401, 424, 438/426, 975; 430/5

(56) References Cited

U.S. PATENT DOCUMENTS

| | | | | |
|---|---|---|---|---|
| 4,849,313 A | | 7/1989 | Chapman et al. | |
| 5,304,441 A | * | 4/1994 | Samuels et al. | 430/30 |
| 5,376,482 A | | 12/1994 | Hwang et al. | |
| 5,780,188 A | * | 7/1998 | Rolson | 430/30 |
| 6,068,954 A | * | 5/2000 | David | 430/22 |
| 6,151,120 A | | 11/2000 | Matsumoto et al. | |
| 6,259,525 B1 | * | 7/2001 | David | 356/399 |
| 6,350,680 B1 | * | 2/2002 | Shih et al. | 438/637 |
| 6,416,909 B1 | * | 7/2002 | Quek et al. | 430/5 |
| 6,456,378 B2 | * | 9/2002 | David | 356/401 |
| 6,509,247 B2 | * | 1/2003 | Chen et al. | 438/401 |
| 6,649,077 B2 | * | 11/2003 | Tsai et al. | 216/92 |
| 2002/0130425 A1 | | 9/2002 | Koike et al. | |
| 2003/0003677 A1 | * | 1/2003 | Fukada | 438/401 |

* cited by examiner

*Primary Examiner*—Alexander Ghyka
(74) *Attorney, Agent, or Firm*—McGinn & Gibb, PLLC; Todd M. C. Li, Esq.

(57) ABSTRACT

A method of repeatedly exposing a pattern across a wafer in a sequential stepping process is disclosed. The pattern that is exposed includes at least one alignment mark. Each time the exposing process is repeated, the current exposure overlaps a portion of the wafer where the pattern was previously exposed and thereby erases a previously exposed alignment mark by re-exposing an area of the wafer where the previously exposed alignment mark was located. After the exposing process is repeated across the wafer, alignment marks remain only in the last exposed areas of the wafer.

20 Claims, 6 Drawing Sheets

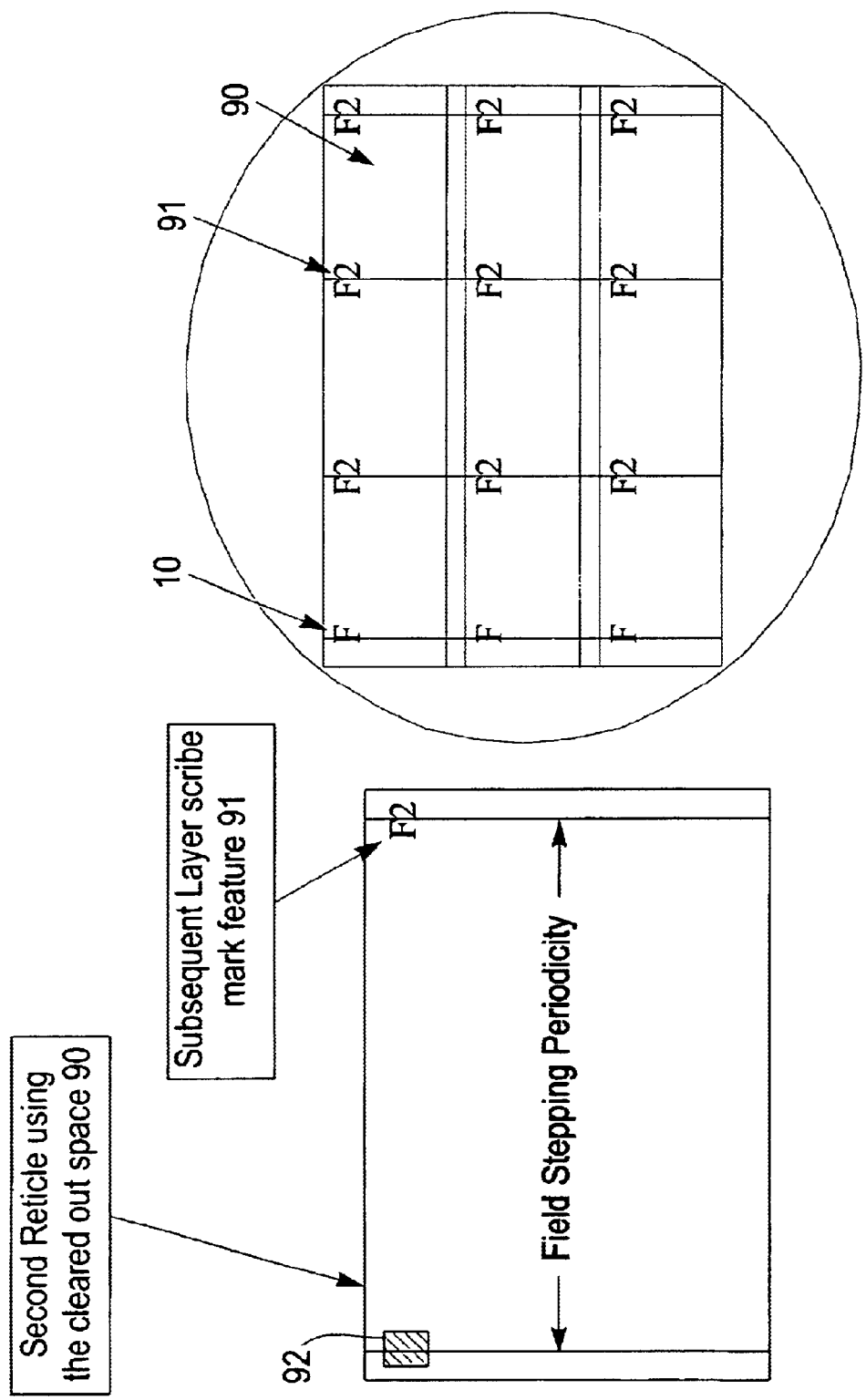

METHOD FOR PRINTING MARKS ON THE EDGES OF WAFERS

BACKGROUND OF INVENTION

1. Field of the Invention

The present invention generally relates to repeated pattern exposure on semiconductor wafers, and more particularly to a process that erases alignment marks as it steps across the wafer so that alignment marks only remain on the edge of the wafer.

2. Description of the Related Art

Semiconductor device fabrication is achieved by lithographical exposures of multiple layers of repeating arrays of circuitry patterns on a wafer. The circuitry patterns of the chips on a wafer are surrounded by non-active regions (kerf regions) that have scribe features used for alignment marks, overlay marks, electrical structures, and other process monitoring structures. In addition to the repeating chip images, scribe features also repeat across the wafer. However, not all scribe features are useful for every single exposure. Inclusion of such non-active features increases the overall die dimension and decreases the number of dies per wafer, which increases unit cost.

SUMMARY OF INVENTION

The present invention details a method of printing marks or features on edges of a repeating array of images, using a mask or reticle in a semiconductor manufacturing (lithography) process. The invention addresses the utility of printing these edge marks on a very limited number of areas, thereby saving valuable space. The invention also provides a methodology of printing features in areas where alignment marks were previously printed. The information printed in these areas can include critical dimension (CD); electrical; film thickness; and other process characterization features.

More specifically, the invention provides a method of repeatedly exposing a pattern across a wafer in a sequential stepping process. The pattern that is exposed includes at least one alignment mark. Each time the exposing process is repeated, the current exposure overlaps a portion of the wafer where the pattern was previously exposed and thereby erases a previously exposed alignment mark by re-exposing an area of the wafer where the previously exposed alignment mark was located. After the exposing process is repeated across the wafer, alignment marks remain only on the edge of the wafer.

In other words, the invention repeatedly exposes a pattern across a wafer by exposing the pattern at a first location (e.g., first semiconductor chip) of the wafer and repeating the exposing process across the wafer, such that the pattern is repeatedly printed across the wafer. Again, this process erases the alignment mark from portions of the wafer where the pattern was previously exposed. The mask includes a transparent region at a location where an image produced by a subsequent exposing process overlaps a previously exposed alignment mark so that the previous alignment mark is erased. The areas of exposure overlap comprise kerf regions (e.g., support regions of the wafer positioned between semiconductor chips). The sequential stepping process can be either a light-field exposure process or a dark-field exposure process.

The invention produces a wafer that has a plurality of semiconductor chips (or similarly printed areas) where the alignment marks are positioned only along one edge of the wafer. In such a structure, each of the semiconductor chips is identical across the wafer. The alignment marks are in a first location with respect to remaining features of respective semiconductor chips located along the edge of the wafer. The other semiconductor chips, that are not along the edge of the wafer, include other exposed patterns (that are not alignment marks) in their respective first locations.

BRIEF DESCRIPTION OF DRAWINGS

The invention will be better understood from the following detailed description of preferred embodiments with reference to the drawings, in which:

FIG. 9 is schematic diagram of a portion of a mask according to the invention;

FIG. 10 is a schematic diagram of an array of exposure patterns on a semiconductor chip with the inventive alignment markings.

DETAILED DESCRIPTION

Figure 2:
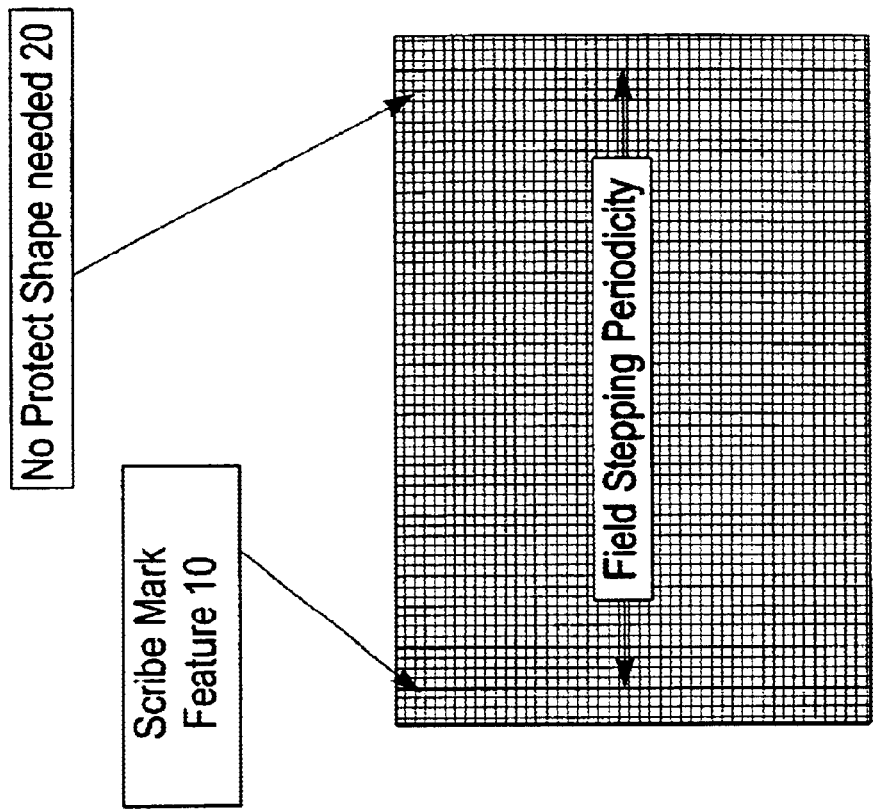
FIG. 2 is a schematic diagram of a portion of a mask.
Figure 1:
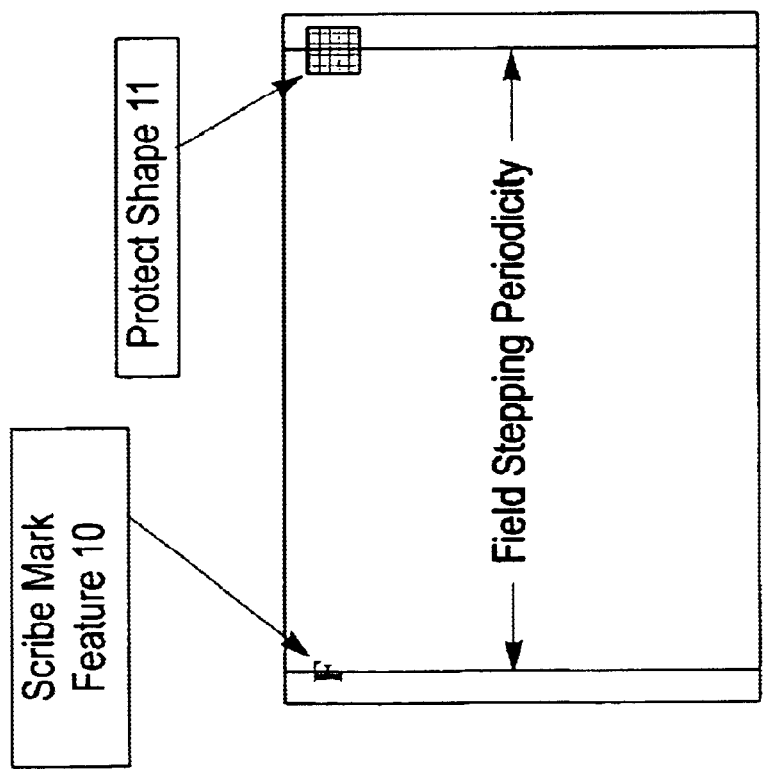
FIG. 1 is a schematic diagram of a portion of a mask.

Currently, alignment marks are printed across all image fields on a wafer. FIGS. 1 and 2 show one mask or reticle. Alternatively, FIGS. 1–2 (and FIGS. 3–4) can show the pattern that will be printed with such masks. Further, in this disclosure the term mask and reticle are used interchangeably and are considered the same or equivalent structures. The invention is equally useful with masks that contain multiple alignment marks. Also, the central portion of the drawings would normally include many mask details that form the structures of the integrated circuit chip. Such internal structures have been intentionally omitted from the drawings so as to focus the viewer's attention on the alignment marks and the salient features of the invention. Such a mask or reticle could be either regular chrome on glass without phase shifting, un-shifted attenuated or alternating phase shift in design. Essentially, each of the squares in FIGS. 1–4 represents a single integrated circuit chip that would be printed on a wafer. As shown in FIGS. 5–8, 10, and 11, multiple integrated circuit chips are formed on the wafer. The integrated circuit chips are separated by kerf regions 201, shown in FIG. 11, which are areas that will be cut away and discarded when the wafer is diced into individual chips.

In FIG. 1, the scribe mark feature 10 and protect shape 11 are opaque regions (chrome) that are blocked from exposure during the lithographic process. FIG. 1 shows the protect-shape 11 for a light-field reticle that is used to prevent printing over or on top of previously printed scribe marks 10 when the images are stepped across a wafer according to a defined periodicity. FIG. 2 shows the reversed polarity of a light-field reticle (e.g., a dark-field). In FIG. 2, the scribe mark feature is exposed and no protect-shape is required. Either one of the reticle types (light-field or dark-field) can be used for chip fabrication.

Figure 4:
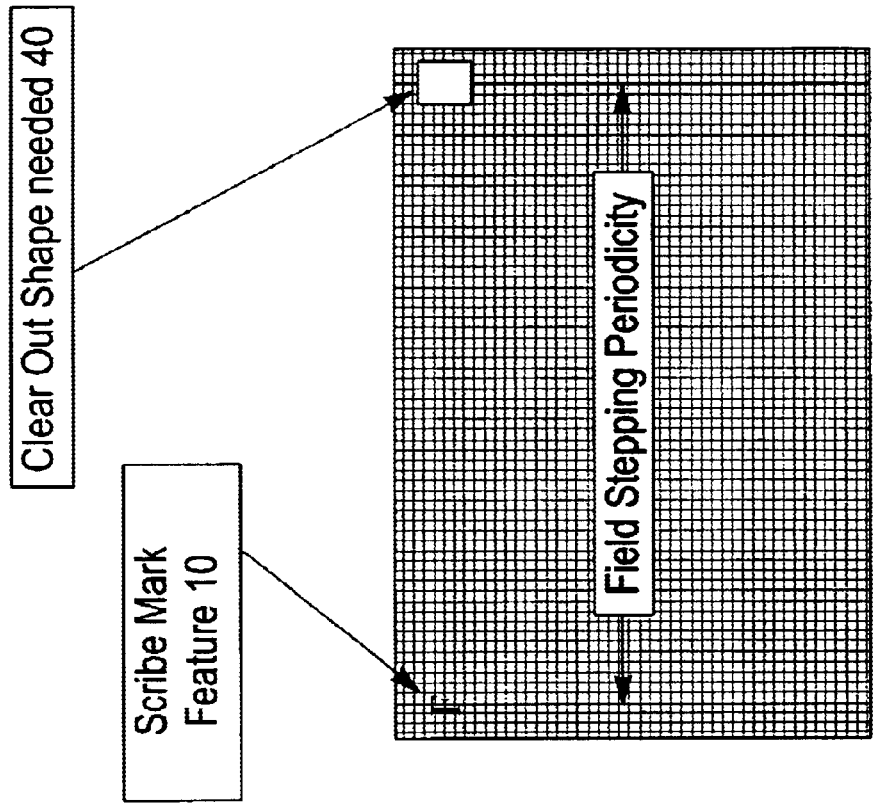
FIG. 4 is schematic diagram of a portion of a mask according to the invention.
Figure 3:
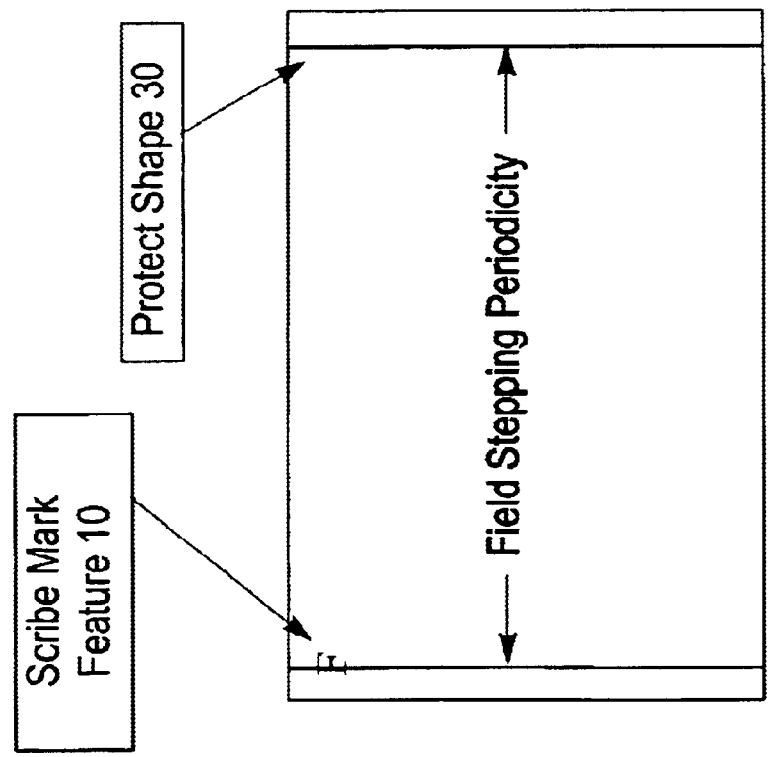
FIG. 3 is schematic diagram of a portion of a mask according to the invention.

FIGS. 3 and 4 illustrate the inventive method using a light-field reticle (also known as a correct positive design) and a dark-field reticle (also known as a correct negative design) respectively. In FIG. 3, the scribe mark 10, labeled F, is also printed but without a protect-shape 11, which is intentionally removed as shown by item 30. With the protect-shape 11 removed, the scribe mark 10 is erased (re-exposed or overexposed) when the neighboring image is exposed during the lithographic process. Similarly, in FIG. 4, a dark-field reticle will have a clear-out shape so that, when the image is stepped, the scribe mark feature is printed over or erased.

Figure 6:
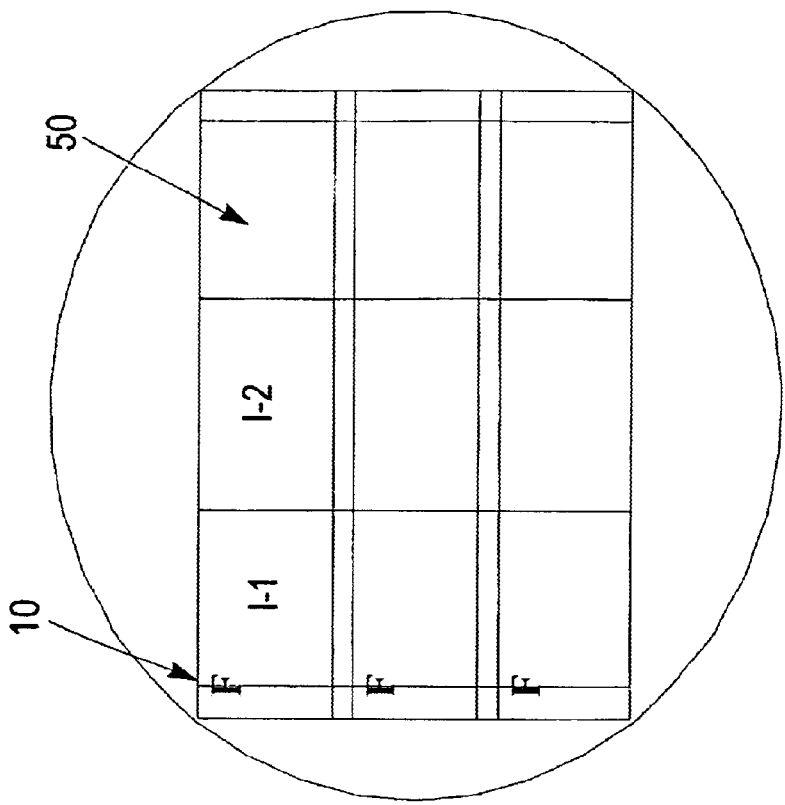
FIG. 6 is a schematic diagram of an array of exposure patterns on a semiconductor chip with the inventive alignment markings.
Figure 5:
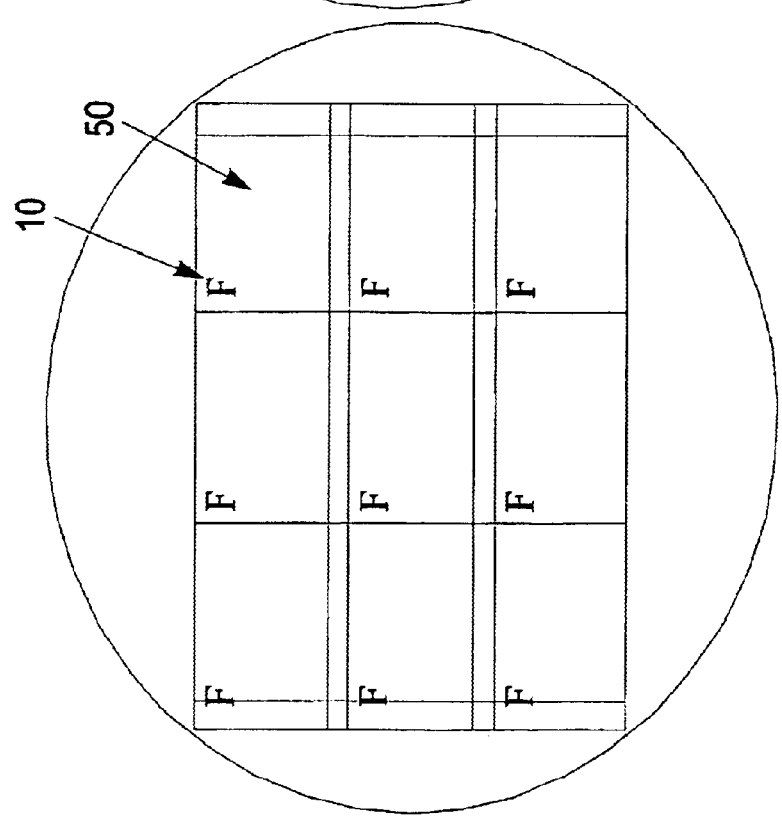
FIG. 5 is a schematic diagram of an array of exposure patterns on a semiconductor chip with conventional alignment markings.

FIGS. 5 and 6 show exposed arrays of images 50 using the light-field masks shown in FIGS. 1 and 3, respectively. Each image 50 represents a single integrated circuit chip. FIG. 5 shows that the scribe mark feature 10 is printed for every image on the wafer because of the protect-shape on the reticle in FIG. 1. However, FIG. 6 is formed according to the mask shown in FIG. 3 and shows that the scribe mark features are restricted to the edge of the array; that is, the outermost images. This is accomplished by the neighboring image stepping one periodicity away, labeled I-1, and printing over (erasing) the exposed scribe feature 10 of the previously exposed field, labeled I-2.

Figure 8:
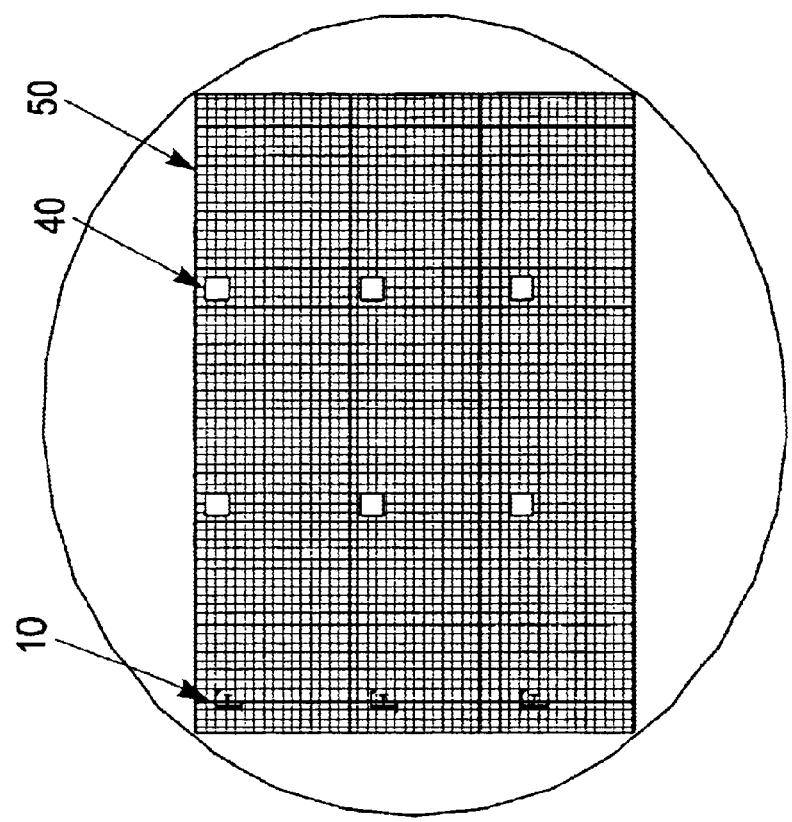
FIG. 8 is a schematic diagram of an array of exposure patterns on a semiconductor chip with the inventive alignment markings.
Figure 7:
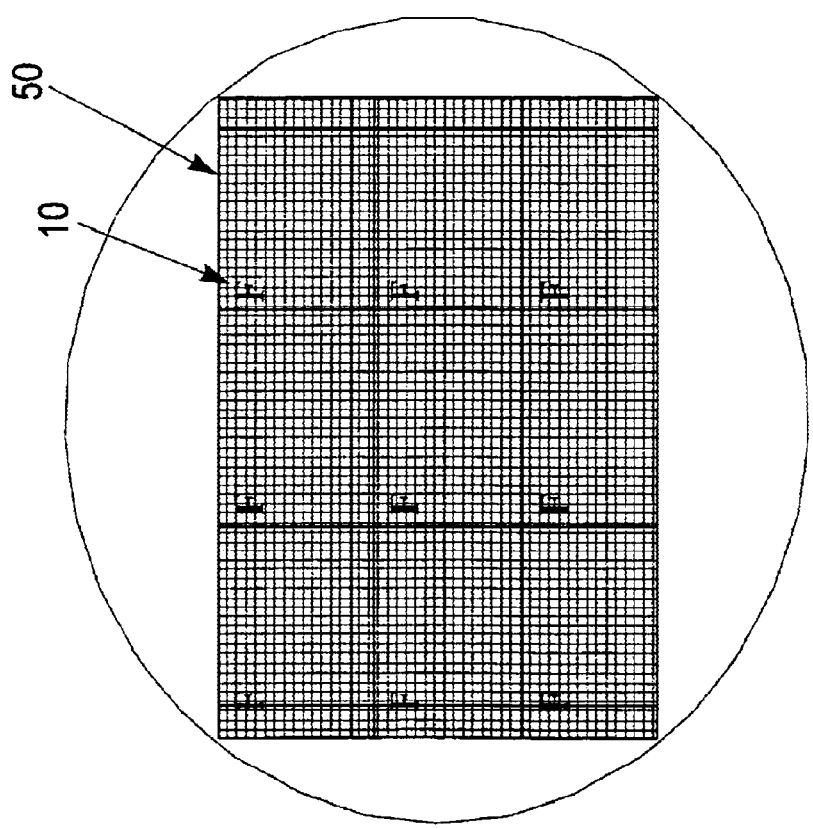
FIG. 7 is a schematic diagram of an array of exposure patterns on a semiconductor chip with conventional alignment markings.

For a dark-field reticle, FIGS. 7 and 8 show the difference between the masks shown in FIGS. 2 and 4, respectively. In FIG. 7, all scribe marks 10 are printed for each image (chip) 50. On the other hand, FIG. 8 shows that the scribe marks 10 are only printed on the outermost edge of the array. This is because the clear-out image 40 exposes the area of the wafer where the scribe marks 10 are printed over so as to erase the scribe marks 10. FIGS. 6 and 8 both show how the current invention can create space in the interior of the array. This space can be used at subsequent steps for printing other useful features.

Thus, the invention provides a method of repeatedly exposing a pattern across a wafer in a sequential stepping process. The pattern that is exposed includes at least one alignment mark 10. Each time the exposing process is repeated, the current exposure overlaps a portion of the wafer where the pattern was previously exposed. As shown in FIGS. 1–4, the mask is wider than the field stepping periodicy, which allows each subsequent exposure to overlap a portion of a previous exposure during the stepping process. In the figures, the masks are designed to be stepped from right to left across the wafer. Therefore, the protect shape 11 will overlap the previously exposed alignment mark 10 in the next subsequent exposure step. Similarly, the clear out shape 40 will overlap a previously exposed scribe mark feature 10 in the next subsequent exposure step. The invention erases (re-exposes, overexposes) a previously exposed alignment mark by re-exposing an area of the wafer where the previously exposed alignment mark was located. After the exposing process is repeated across the wafer, alignment marks remain only in the last exposed areas of the wafer.

Thus, the invention repeatedly exposes a pattern (e.g., FIGS. 3–4) across a wafer by exposing the pattern at a first location (e.g., first semiconductor chip I2) of the wafer and repeating the exposing process across the wafer (e.g., at I1), such that the pattern is repeatedly printed across the wafer (in this example from right to left across the wafer). Again, this process erases the alignment mark 10 from portions of the wafer where the pattern was previously exposed (I2). The mask includes a transparent region (e.g., clear out shape 40 or absence of a protect shape 30) at a location where an image produced by a subsequent exposing process overlaps a previously exposed alignment mark so that the previous alignment mark is erased. The areas of exposure overlap comprise kerf regions (e.g., support regions of the wafer positioned between semiconductor chips).

FIGS. 9 and 10 illustrate how the invention utilizes the space saved by limiting the alignment marks to one edge of the wafer. More specifically, FIGS. 9 and 10 illustrates a reticle 90 having a second different scribe mark feature 91, labeled F2. This reticle 90 would be used in a subsequent stepping process. This scribe mark feature 91 is not necessarily another alignment mark. To the contrary, the scribe mark 91 could comprise critical dimension (CD); electrical; film thickness; and other process characterization features. When this reticle 90 is stepped over the array, shown in FIG. 10, the subsequent scribe mark feature 91 is printed in the available space without printing over the first feature 10. In order to avoid it printing over the alignment mark 10, the reticle 90 can include a protect shape 92 or other similar feature. The dark-field mask is constructed the same way and the same result appears. Thus, the forgoing demonstrates that two different features (10 and 90) can be place in the same periodic spacing without any extra lithography steps.

Figure 11:
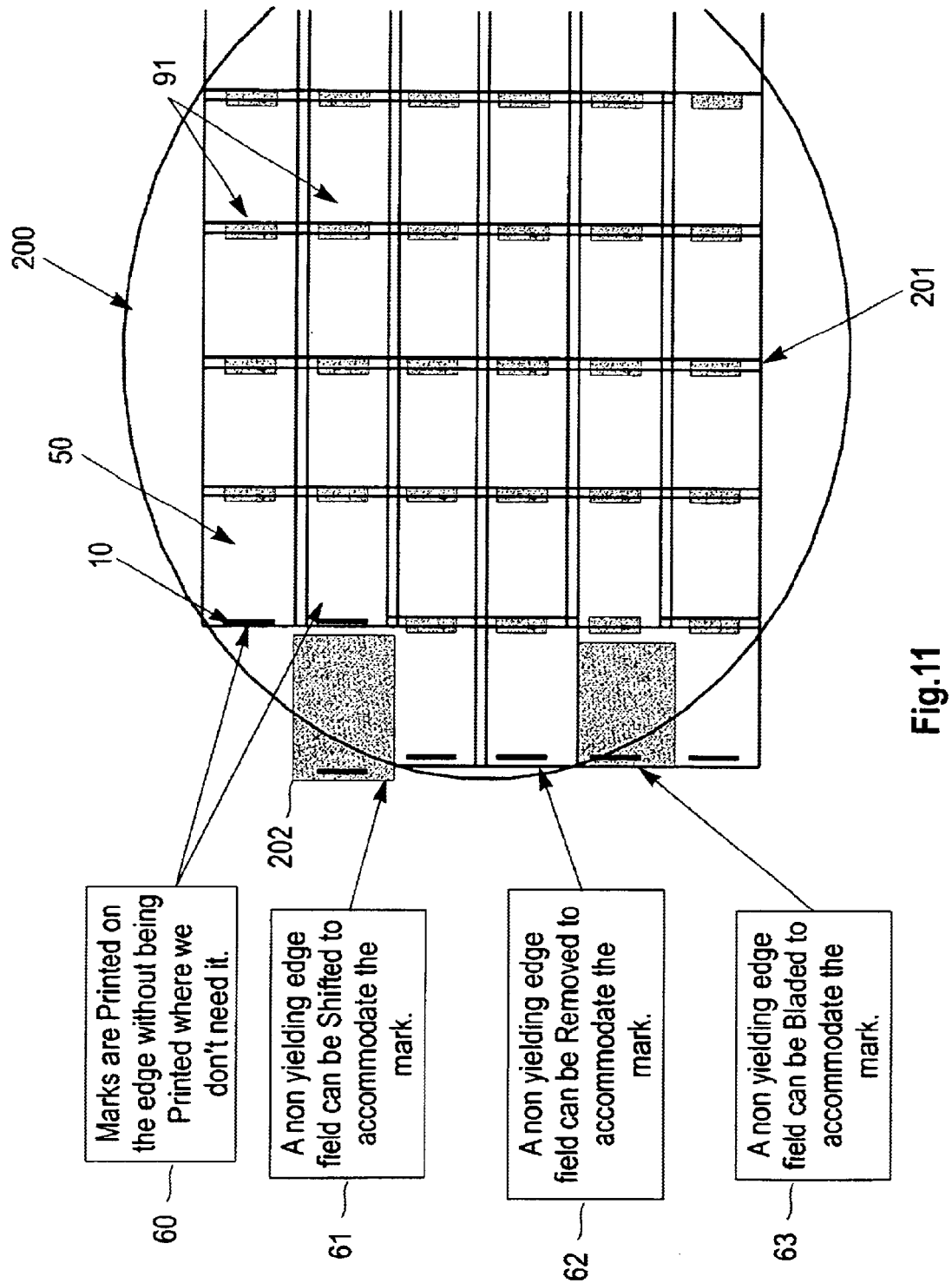
FIG. 11 is a schematic diagram of the wafer illustrating the alignment marks appearing only along one edge of the wafer.

FIG. 11 illustrates many advantages produced by the invention. More specifically, FIG. 11 illustrates a wafer 200 that includes the inventive alignment marks 10 positioned only along the left-hand edge exposures. In addition, FIG. 11 illustrates the secondary mark 91 printed within the kerf 201 regions. As shown by item 60, the marks are only printed along the left-hand edge of the wafer 200 without being printed in areas where they are not needed. Item 61 shows that a non-yielding exposure field 50 can be shifted (by an amount required) to not overlap with the neighboring field. Specific shifting is programmed into the exposure recipe file. Item 62 shows that an exposure 202 can be omitted from the stepping sequence if this exposure is not-yielding (will not produce a good semiconductor chip) and if the printing of the alignment mark 10 will not occur within the central region of the wafer 200. Item 63 illustrates that a non-yielding edge ship can be bladed or framed so as to accommodate printing of the alignment marks 10 on where exposure 50 would otherwise have been printed.

Items 61, 62 and 63 are methods to achieve the desired result of this invention (of printing edge marks). There are three conventional ways of printing edge marks. One way is to drop marks from another reticle. The disadvantage of this is that it requires the use of two reticles, with reticle swap occurring for each wafer to be exposed. This also requires re-adjusting the framing blades in the tool for each reticle swap. Another conventional way is to open the framing blade to expose a mark in the outer kerf area. This requires enough room on the reticle but it is, otherwise, similar to item 63 in terms of time required. The third conventional way is to drop marks from the same reticle. This requires framing all four sides of the reticle and more programming of the recipe file to specify the mark exposure position.

Thus, as shown above, the invention prints alignment marks only on edge which frees up scribe space for other useful purposes. This procedure saves more time than if one was to drop-in marks at the edge and, is simpler in design. If one were to drop-in marks only along the edge locations, this would require four framing blade movements and a different stepping within the step-and-scan or a step-and-repeat exposure system. To the contrary, the methodology discussed above only one blade movement and no stepping change, or no blade movements and one stepping change. This invention utilizes a mask design that, in one shot, exposes alignment marks specifically at the edge while also erasing un-wanted or un-needed marks in the inner region of the wafer. The simplicity of the inventive design can reduce the errors associated when programming marks are to be dropped.

While the invention has been described in terms of preferred embodiments, those skilled in the art will recognize that the invention can be practiced with modification within the spirit and scope of the appended claims.

What is claimed is:

1. A method of repeatedly exposing a pattern across a wafer, said method comprising:

exposing said pattern at a first location of said wafer, wherein said pattern includes at least one alignment mark; and repeating said exposing process across said wafer, such that said pattern is repeatedly printed across said wafer, wherein said process of repeating said exposing process erases said alignment mark from portions of said wafer where said pattern was previously exposed.

2. The method in claim 1, wherein each time said exposing process is repeated, the current exposure overlaps a portion of said wafer where said pattern was previously exposed.

3. The method in claim 1, wherein said process of repeating said exposing process erases said first alignment mark by re-exposing an area of said wafer where said first alignment mark was previously exposed.

4. The method in claim 1, wherein each repetition of said exposing process across said wafer erases a previous alignment mark.

5. The method in claim 1, wherein, after said exposing process is repeated across said wafer, alignment marks remain only on the edge of said wafer.

6. The method in claim 1, wherein said exposing process and said process of repeating said exposing process utilize the same mask to expose said pattern.

7. The method in claim 6, wherein said mask includes a transparent region at a location where an image produced by a subsequent exposing process overlaps a previously exposed alignment mark.

8. A method of exposing chips on a wafer, said method comprising:

a first exposing process of exposing at least one first integrated circuit chip and at least one first alignment mark on a wafer; and a second exposing process of exposing at least one second integrated circuit chip, adjacent said first integrated circuit chip, and at least one second alignment mark on said wafer, wherein said second exposing process erases said first alignment mark.

9. The method in claim 8, wherein said second exposing process overlaps area of said wafer exposed by said first exposing process.

10. The method in claim 8, wherein said second exposing process erases said first alignment mark by re-exposing an area of said wafer where said first alignment mark was previously exposed.

11. The method in claim 8, further comprising repeating said second exposing process across said wafer, wherein each repetition of said second exposing process erases a previous alignment mark.

12. The method in claim 8, further comprising repeating said second exposing process across said wafer, wherein after said second exposing process is repeated across said wafer, alignment marks remain only on the edge of said wafer.

13. The method in claim 8, wherein said first exposing process and said second exposing process utilize the same mask.

14. The method in claim 13, wherein said mask includes a transparent region at a location where an image produced by said second exposing process overlaps said first alignment mark.

15. A method of repeatedly exposing a pattern across a wafer, said method comprising: repeatedly exposing said pattern across said wafer in a sequential stepping process, wherein said pattern includes at least one alignment mark, wherein each time said exposing process is repeated, the current exposure overlaps a portion of said wafer where said pattern was previously exposed and thereby erases a previously exposed alignment mark by re-exposing an area of said wafer where said previously exposed alignment mark was located, and wherein, after said exposing process is repeated across said wafer, alignment marks remain only on the edge of said wafer.

16. The method in claim 15, wherein said sequential stepping process utilizes the same mask to repeatedly expose said pattern at different locations across said wafer.

17. The method in claim 16, wherein said mask includes a transparent region at a location where an image produced by a subsequent exposing process overlaps a previously exposed alignment mark.

18. The method in claim 15, wherein, during said sequential stepping process, areas of exposure overlaps comprise one of kerf regions and support regions of said wafer positioned between semiconductor chips.

19. The method in claim 15, wherein after said sequential stepping process has stepped across said wafer, said process further comprises a second exposing process that exposes patterns in areas where alignment marks were erased.

20. The method in claim 15, wherein said sequential stepping process comprises one of a light-field exposure process and a dark-field exposure process.

* * * * *